United States Patent
Ng et al.

(10) Patent No.: US 7,822,082 B2
(45) Date of Patent: Oct. 26, 2010

(54) WAVELENGTH RECONFIGURABLE LASER TRANSMITTER TUNED VIA THE RESONANCE PASSBANDS OF A TUNABLE MICRORESONATOR

(75) Inventors: Willie W. Ng, Agoura Hills, CA (US); Robert R. Hayes, Calabasas, CA (US); Daniel Yap, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 167 days.

(21) Appl. No.: 10/766,103

(22) Filed: Jan. 27, 2004

(65) Prior Publication Data

US 2005/0163171 A1 Jul. 28, 2005

(51) Int. Cl.
*H01S 3/10* (2006.01)
(52) U.S. Cl. .............. 372/20; 372/94; 372/98; 372/50.11; 372/50.22
(58) Field of Classification Search .......... 372/20, 372/50.1, 50.11, 50.22, 94, 98
See application file for complete search history.

(56) References Cited

U.S. PATENT DOCUMENTS

| | | | |
|---|---|---|---|
| 4,028,702 A | 6/1977 | Levine | 343/100 SA |
| 4,296,319 A | 10/1981 | Franks et al. | 250/227 |
| 4,601,027 A | 7/1986 | Scarr et al. | |
| 5,001,336 A | 3/1991 | de la Chapelle | 250/208.2 |
| 5,153,762 A | 10/1992 | Huber | 359/125 |
| 5,379,309 A | 1/1995 | Logan, Jr. | 372/18 |
| 5,383,198 A | 1/1995 | Pelouch et al. | 372/18 |
| 5,404,006 A | 4/1995 | Schaffner et al. | 250/208.2 |
| 5,428,814 A | 6/1995 | Mort et al. | 455/12.1 |
| 5,450,223 A | 9/1995 | Wagner et al. | |
| 5,504,774 A | 4/1996 | Takai et al. | 375/134 |
| 5,548,434 A | 8/1996 | Shimonaka et al. | |
| 5,577,057 A | 11/1996 | Frisken | 372/18 |
| 5,617,239 A | 4/1997 | Walker | 359/181 |
| 5,625,729 A | 4/1997 | Brown | 385/31 |
| 5,687,261 A | 11/1997 | Logan | 385/24 |
| 5,710,651 A | 1/1998 | Logan, Jr. | 359/145 |
| 5,723,856 A | 3/1998 | Yao et al. | 250/227.1 |
| 5,777,778 A | 7/1998 | Yao | 59/245 |
| 5,796,506 A | 8/1998 | Tsai | 359/191 |
| 5,859,611 A | 1/1999 | Lam et al. | 342/368 |

(Continued)

FOREIGN PATENT DOCUMENTS

EP    0 352 747 A2    1/1990

(Continued)

OTHER PUBLICATIONS

Bilodeau, F., et al., "An All-Fiber Dense-Wavelength-Division Multiplexer/Demultiplexer Using Photoimprinted Bragg Gratings," IEEE Photonics TechnologyLetters. vol. 7, No. 4, pp. 388-390 (Apr. 1995).*

(Continued)

*Primary Examiner*—Todd T Van Roy
(74) *Attorney, Agent, or Firm*—Ladas & Parry

(57) ABSTRACT

The present invention relates to a laser transmitter capable of being configured to transmit one of a plurality of wavelengths. Specifically, the laser transmitter may be reconfigured using the resonance passbands of a tunable microresonator coupled with a fixed grating.

35 Claims, 10 Drawing Sheets

U.S. PATENT DOCUMENTS

| | | | |
|---|---|---|---|
| 5,861,845 A | 1/1999 | Lee et al. | 342/375 |
| 5,917,179 A | 6/1999 | Yao | 50/227.1 |
| 5,917,970 A | 6/1999 | Burns et al. | 385/24 |
| 5,929,430 A | 7/1999 | Yao et al. | 250/205 |
| 5,930,031 A | 7/1999 | Zhou et al. | 359/344 |
| 5,933,113 A | 8/1999 | Newberg et al. | 342/375 |
| 5,999,128 A | 12/1999 | Stephens et al. | 342/375 |
| 6,027,254 A * | 2/2000 | Yamada et al. | 385/88 |
| 6,061,369 A * | 5/2000 | Conradi | 372/6 |
| 6,178,036 B1 | 1/2001 | Yao | 359/334 |
| 6,188,808 B1 | 2/2001 | Zhou et al. | 385/3 |
| 6,195,187 B1* | 2/2001 | Soref et al. | 398/9 |
| 6,201,638 B1 | 3/2001 | Hall et al. | 359/346 |
| 6,215,592 B1* | 4/2001 | Pelekhaty | 359/260 |
| 6,262,681 B1 | 7/2001 | Persechini | 342/188 |
| 6,320,888 B1* | 11/2001 | Tanaka et al. | 372/32 |
| 6,341,025 B1 | 1/2002 | Mizrahi et al. | |
| 6,348,890 B1 | 2/2002 | Stephens | 342/375 |
| 6,388,787 B1 | 5/2002 | Bischoff | 359/187 |
| 6,452,546 B1 | 9/2002 | Stephens | 342/368 |
| 6,556,322 B1 | 4/2003 | Desurvire | |
| 6,580,532 B1 | 6/2003 | Yao et al. | 359/111 |
| 6,591,026 B2 | 7/2003 | Endo et al. | 385/15 |
| 6,643,299 B1 | 11/2003 | Lin | 372/6 |
| 6,661,974 B1 | 12/2003 | Ooi et al. | |
| 6,724,523 B2 | 4/2004 | Yap | 359/333 |
| 6,724,783 B2 | 4/2004 | Jalali et al. | 372/9 |
| 6,731,829 B2 | 5/2004 | Ionov | 385/15 |
| 6,816,516 B2* | 11/2004 | Daiber | 372/20 |
| 6,852,556 B2 | 2/2005 | Yap | 438/22 |
| 6,867,904 B2 | 3/2005 | Ng et al. | 359/332 |
| 6,872,985 B2 | 3/2005 | Yap | 257/82 |
| 6,940,878 B2* | 9/2005 | Orenstein et al. | 372/20 |
| 7,050,723 B2 | 5/2006 | Katagiri et al. | |
| 7,079,772 B2 | 7/2006 | Graves et al. | |
| 7,085,499 B2 | 8/2006 | Yap et al. | 398/183 |
| 2001/0038318 A1 | 11/2001 | Johnson et al. | 331/135 |
| 2002/0021464 A1 | 2/2002 | Way | 359/124 |
| 2002/0122615 A1* | 9/2002 | Painter et al. | 385/15 |
| 2003/0003961 A1 | 1/2003 | Li et al. | 455/562 |
| 2003/0080898 A1 | 5/2003 | Wang et al. | 342/359 |
| 2003/0089843 A1 | 5/2003 | Sayyah et al. | 250/227.21 |
| 2003/0090767 A1 | 5/2003 | Yap et al. | 359/181 |
| 2003/0091097 A1 | 5/2003 | Yap et al. | 375/132 |
| 2003/0197917 A1 | 10/2003 | Yap et al. | 359/330 |
| 2003/0227629 A1 | 12/2003 | Dobbs et al. | 356/437 |
| 2004/0120638 A1* | 6/2004 | Frick | 385/2 |
| 2004/0131093 A1* | 7/2004 | Waarts et al. | 372/22 |
| 2004/0136412 A1* | 7/2004 | Jones | 372/20 |
| 2004/0264514 A1* | 12/2004 | Kim | 372/20 |
| 2004/0264977 A1 | 12/2004 | Yap et al. | 398/161 |
| 2005/0013612 A1 | 1/2005 | Yap | 398/53 |

FOREIGN PATENT DOCUMENTS

| | | |
|---|---|---|
| JP | 07-26136 | 1/1995 |
| JP | 07-264136 | 10/1995 |
| WO | 99/66613 | 12/1999 |
| WO | 00/44074 | 7/2000 |
| WO | 00/45213 A1 | 8/2000 |
| WO | 01/29992 A1 | 4/2001 |
| WO | 01/08507 A2 | 10/2001 |
| WO | 02/099939 A1 | 12/2002 |
| WO | 03/042734 A1 | 5/2003 |
| WO | 03/043126 A1 | 5/2003 |
| WO | 03/043147 A1 | 5/2003 |
| WO | 03/043177 A2 | 5/2003 |
| WO | 03/043178 A2 | 5/2003 |
| WO | 03/043195 A1 | 5/2003 |
| WO | 03/043231 A2 | 5/2003 |

OTHER PUBLICATIONS

Madsen et al. "Planar Waveguide Optical Spectrum Analyzer Using a UV-Induced Grating" IEEE Journal of Selected Topics in Quantum Electronics. vol. 4, No. 6, pp. 925-929, Nov./Dec. 1998.*

Tishinin et al. ("Vertical Resonant Couplers with Precise Coupling Efficiency Control Fabricated by Wafer Bonding", IEEE Photonics Technology Letters, vol. 11, No. 8 pp. 1003-1005, Aug. 1999).*

Selected definitions from Wikapedia at http://en.wikipedia.org accessed Jul. 27, 2006.*

Agrawal, G.P., *Nonlinear Fiber Optics*, Academic Press, Chapter 9, pp. 370-398 (1995).

Alexe, M., et al., "Low Temperature GaAs/Si Direct Wafer Bonding," *Electronics Letters*, vol. 36, No. 7 (Mar. 30, 2000).

Bennett, S., et al., "1.8-THz Bandwidth, Zero-Frequency Error, Tunable Optical Comb Generator for DWDM Applications," *IEEE Photonics Technology Letters*, vol. 11, No. 5, pp. 551-553 (May 1999).

Berger, J.D., et al., "Widely Tunable External Cavity Diode Lase Base On A MEMS Electrostatic Rotary Actuator," *Paper TuJ2-1*, OFC, Anaheim, California, pp. TuJ2-1-TuJ2-3 (2001).

Bilodeau, F., et al., "An All-Fiber Dense-Wavelength-Division Multiplexer/Demultiplexer Using Photoimprinted Bragg Gratings," *IEEE Photonics Technology Letters*, vol. 7, No. 4, pp. 388-390 (Apr. 1995).

Bordonalli, A.C., et al., "High-Performance Phase Locking of Wide Linewidth Semiconductor Lasers by Combined Use of Optical Injection Locking and Optical Phase-Lock Loop," *Journal of Lightwave Technology*, vol. 17, No. 2, pp. 328-342 (Feb. 1999).

Chan, W.K., et al., "Grafted Semiconductor Optoelectronics," *IEEE Journal of Quantum Electronics*, vol. 27, No. 3, pp. 717-725 (Mar. 1991).

Chu, S.T, et al., °an Eight-Channel Add-Drop Filter Using Vertically Coupled If, Microring Resonators over a Cross Grid,' IEEE Journal of Technology Letters, Vol. 11, No. 6, pp. 691-693 (Jun. 1999).

Chu, S.T., et al., "Wavelength Trimming of a Microring Resonator Filter by Means of a UV Sensitive Polymer Overlay," *IEEE Photonics Technology Letters*, vol. 11, No. 6, pp. 688-690 (Jun. 1999).

Collins, J.V., et al., "Passive Alignment of Second Generation Optoelelectronic Devices," *IEEE Journal of Selected Topics In Quantum Electronics*, vol. 3, No. 6, pp. 1441-1444 (Dec. 1997).

Corbett, B., et al., "Low-Threshold Lasing in Novel Microdisk Geometries," *IEEE Photonics Technology Letters*, vol. 8, No. 7, pp. 855-857 (Jul. 1996).

Corbett, B., "Spectral Characteristics of Low Threshold Microdisks," *IEEE Lasers and Electro-Optics Society 1996 Annual Meeting*, vol. 2, pp. 197-198 (1996).

Deckman, B., et al., "A 5-Watt, 37-GHz Monolithic Grid Amplifier," *IEEE MTT-S Digest*, pp. 805-808 (2000).

Escalera, N., et al., "Ka-Band, 30 Watts Solid State Power Amplifier," *IEEE MTT-S Digest*, paper TU1F-42, pp. 561-563 (2000).

Fukushima, S., et al., "Direct Opto-Electronic Sythesis of mW-Level Millimeter-Wave Signals Using An Optical Frequency Comb Generator and a Uni-Traveling-Carrier Photodiode," *IEEE MTT-S Digest*, pp. 69-72 (2001).

Ghirardi, F., et al., "Monolithic Integration of an InP Based Polarization Diversity Heterodyne Photoreceiver with Electrooptic Adjustability," *Journal of Lightwave Technology*, vol. 13, No. 7, pp. 1536-1549 (Jul. 1995).

Goldsmith, C.L., et al., "Principles and Performance of Traveling-Wave Photodetector Arrays," *IEEE Transactions on Microwave Theory and Techniques*, vol. 45, No. 8, pp. 1342-1350 (Aug. 1997).

Hansen, D.M., et al., "Development Of A Glass-Bonded Complaint Substrate," *Journal of Crystal Growth*, vol. 195, pp. 144-150 (1998).

Haus, H., et al., "Narrow-Band Optical Channel-Dropping Filter," *Journal of Lightwave Technology*, vol. 10, No. 1, pp. 57-61 (Jan. 1992).

Ibsen, M., et al., "30dB Sampled Gratings In Germanosilicate Planar Waveguides," *Electronics Letters*, vol. 32, No. 24, pp. 2233-2235 (Nov. 21, 1996).

Ih, C.S., et al., "Dense All Optical WDM-SCM Technology for High Speed Computer Interconnects," *Optoelectronic Interconnects*, SPIE, vol. 1849, pp. 308-318 (1993).

Ingram, D.L., et al., "Compact W-Band Solid-State MMIC High Power Sources," *IEEE MTT-S Digest*, pp. 955-958 (2000).

Jayaraman, V., et al., "Extended Tuning Range in Sampled Grating DBR Lasers," *IEEE Photonics Technology Letters*, vol. 5, No. 5, pp. 489-491 (May 1993).

Johansson, L.A., et al., "Millimeter-Wave Modulated Optical Signal Generation with High Spectral Purity and Wide-Locking Bandwidth Using a Fiber-Integrated Optical Injection Phase-Lock Loop," *IEEE Photonics Technology Letters*, vol. 12, No. 6, pp. 690-692 (Jun. 2000).

Kato, K., et al., "PLC Hybrid Integration Technology And Its Application To Photonic Components," *IEEE Journal of Selected Topics in Quantum Electronics*, vol. 6, No. 1, pp. 4-13 (2000).

Kato, K., "Ultrawide-Band/High-Frequency Photodetectors," *IEEE Transactions on Microwave Theory and Techniques*, vol. 47, No. 7, pp. 1265-1281 (Jul. 1999).

Kazarinov, R., et al., "Narrow-Band Resonant Optical Reflectors and Resonant Optical Transformers for Laser Stabilization and Wavelength Division Multiplexing," *IEEE Journal of Quantum Electronics*, vol. QE-23, No. 9, pp. 1419-1425 (Sep. 1987).

Kazovsky, L.G., et al., "A 1320-nm Experimental Optical Phase-Locked Loop: Performance Investigation and PSK Homodyne Experiments at 140 Mb/s and 2 Gb/s," *Journal of Lightwave Technology*, vol. 8, No. 9; pp. 1414-1425 (Sep. 1990).

Kikuchi, K., et al., "Amplitude-Modulation Sideband Injection Locking Characteristics of Semiconductor Lasers and their Application," *Journal of Lightwave Technology*, vol. 6, No. 12, pp. 1821-1830 (Dec. 1988).

Kitayama, K., "Highly-Stabilized, Tunable Millimeter-Wave Generation by Using Fiber-Optic Frequency Comb Generator," *Microwave Photonics*, pp. 13-16 (Dec. 3, 1996).

Kobayashi, Y., et al., "Optical FM signal Amplification and FM Noise Reduction in an Injection Locked AlGaAs Semiconductor Laser," *Electronics Letters*, vol. 17, No. 22, pp. 849-851 (Oct. 29, 1981).

Lee, C.C., et al., "Measurement of Stimulated-Brillouin-Scattering Threshold for Various Types of Fibers Using Brillouin Optical-Time-Domain Reflectometer," *IEEE Photonics Technology Letters*, vol. 12, No. 6, pp. 672-674 (Jun. 2000).

Little, B.E., et al., "Ultra-Compact Si-$SiO_2$ Microring Resonator Optical Channel Dropping Filters," *IEEE Photonics Technology Letters*, vol. 10, No. 4, pp. 549-551 (Apr. 1998).

Little, B.E., "Vertically Coupled Glass Microring Resonator Channel Dropping Filters," *IEEE Photonics Technology Letters*, vol. 11, No. 2, (Feb. 1999).

Little, B.E., et al., "Wavelength Switching and Routing Using Absorption and Resonance," *IEEE Photonics Technology Letters*, vol. 10, No. 6, pp. 816-818 (Jun. 1998).

Liu, T., et al., "InP-Based DHBT with 90% Power-Added Efficiency and 1 W Output Power at 2 GHZ," *Solid-State Electronics*, vol. 41, No. 10, pp. 1681-1686 (1997).

London, J.M., "Preparation of Silicon-on-Gallium Arsenide Wafers for Monolithic Optoelectronic Integration," *IEEE Photonics Technology Letters*, vol. 11, No. 8, pp. 958-960 (1999).

MacDonald, R.I., et al., "Hybrid Optoelectronic Integrated Circuit," *Applied Optics*, vol. 26, No. 5, pp. 842-844 (Mar. 1, 1987).

Murthy, S., et al., "A Novel Monolithic Distributed Traveling-Wave Photodector with Parallel Optical Feed," *IEEE Photonics Technology Letters*, vol. 12, No. 6, pp. 681-683 (Jun. 2000).

Ng., W., et al., "High-Efficiency Waveguide-Coupled $\lambda$=1.3 µm $In_xGa_{1-x}As$/GaAs MSM Detector Exhibiting Large Extinction Ratios at $L$ and $X$ Band", *IEEE Photonics Technology Letters*, vol. 5, No. 5, pp. 514-517 (1993).

Ng, W., et al., "High-Speed Single-and Multi-Element Fiber-Grating Coupled Diode Laser Transmitters for WDM Networks," *IEEE*, pp. 362-363 (1998).

*Radio Frequency Photonic Synthesizer*, United Telecommunications Products, Inc., Chalfont, PA, Transmission Systems Division, (Jan. 2000).

Ramos, R.T., et al., "Optical Injection Locking and Phase-Lock Loop Combined Systems," *Optics Letters*, vol. 19, No. 1, pp. 4-6 (Jan. 1, 1994).

Sakamoto, S.R., et al., "Substrate Removed GaAs-AlGaAs Electrooptic Modulators", *IEEE Photonics Technology Letters*, vol. 11, No. 10, pp. 1244-1246 (1999).

Sarlet, G., et al., "Wavelength and Mode Stabilization of Widely Tunable SG-DBR and SSG-DBR Lasers," *IEEE Photonics Technology Letters*, vol. 11, No. 11, pp. 1351-1353 (Nov. 1999).

Sayyah, K., et al., "Multi-Tone Photonic Oscillator," *Proceedings of the SPIE*, vol. 4490, pp. 52-62 (2001).

Schäffer, C.G., "Application of Optical Amplifiers in a Microwave Distribution Network for Phased Array Antennas," *Lasers and Electro-Optics Society Annual Meeting*, 1995, 8th Annual Meeting Conference Proceedings, vol. 1, pp. 202-203 (Oct. 30-31, 1995).

Shimizu, N., et al., "InP-InGaAs Uni-Traveling-Carrier Photodiode With Improved 3-dB Bandwidth of Over 150 GHz," *IEEE Photonics Technology Letters*, vol. 10, No. 3, pp. 412-414 (Mar. 1998).

Tishinin, D.V., et al., "Vertical Resonant Couplers with Precise Coupling Efficiency Control Fabricated by Wafer Bonding", *IEEE Photonics Technology Letters*, vol. 11, No. 8, pp. 1003-1005 (1999).

Tsao, S.-L, "Phaselocked Tunable Subcarrier Comb Generator," *Electronics Letters*, vol. 30, No. 24, pp. 2059-2060 (Nov. 24, 1994).

Yamamoto, T., et al., "270-360 Ghz Tunable Beat Signal Light Generator For Photonic Local Oscillator," *Electronics Letters*, vol. 38, No. 15, pp. 795-797 (Jul. 2002).

Yanagisawa, M., et al., "Film-Level Hybrid Integration of AlGaAs Laser Diode with Glass Waveguide on Si Substrate," *IEEE Photonics Technology Letters*, vol. 4, No. 1, pp. 21-23 (Jan. 1992).

Yao, X.S., et al., "High Frequency Optical Subcarrier Generator," *Electronics Letters*, vol. 30, No. 18, pp. 1525-1526 (Sep. 1, 1994).

Yao, X.S., "High-Quality Microwave Signal Generation by Use of Brillouin Scattering in Optical Fibers," *Optics Letters*, vol. 22, No. 17, pp. 1329-1331 (Sep. 1, 1994).

Yao, X.S., "Multiloop Optoelectronic Oscillator," *IEEE Journal of Quantum Electronics*, vol. 36, No. 1, pp. 79-84 (Jan. 2000).

Yao, X.S., et al., "Optoelectronic Microwave Oscillator," *J. Opt. Soc. Am. B*, vol. 13, No. 8, pp. 1725-1735 (Aug. 1996).

Yao, X.S., et al., "Optoelectronic Oscillator for Photonic Systems," *IEEE Journal of Quantum Electronics*, vol. 32, No. 7, pp. 1141-1149 (Jul. 1996).

Yap, D., et al., "Agile Waveform Generation & Frequency Conversion," *RF-Lightwave Integrated Circuits Program Kickoff Meeting*, pp. DY1-DY10 (Aug. 16, 2000).

Yap, D., et al., "Switched Photonic Link for Distribution of Local-Oscillator Signals," *IEEE Photonics Technology Letters*, vol. 12, No. 11, pp. 1552-1554 (Nov. 2000).

Yi-Yan, A., et al., "GaInAs/InP pin Photodetectors Integrated with Glass Waveguides," *Electronics Letters*, vol. 27, No. 1, pp. 87-89 (Jan. 3, 1991).

Yi-Yan, A., et al., "Semiconductor-Film Grafting: A New Approach to OEICs," *Circuits & Devices*, pp. 26-30 (May 1992).

Logan Jr., R., et al., "All-Optical Heterodyne RF Signal Generation Using a Mode-locked-laser Frequency Comb: Theory and Experiments", *Microwave Symposium Digest*, 200 IEEE MTT-S Internal vol. 3, pp. 1741-1744 (Jun. 2000).

Gliese, U, et al., "A wideband heterodyne optical phase-locked loop for generation of 3-18 GHZ microwave carries", *IEEE Photonics Technology Letters*, vol. 4, pp. 936-938 (Aug. 1992).

U.S. Appl. No. 10/696,607, filed Oct. 28, 2003, Yap.

U.S. Appl. No. 10/766,103, filed Jan. 24, 2004, Ng, et al.

Abstract of JP 07-264136, Patent Abstracts of Japan, vol. 1996, No. 2 (Feb. 1996).

Chang, K., Handbook of Microwave and Optical Components, *John Wiley and Sons*, pp. 595-626, 670-674 (1989).

Ih, C.S., et al., "Dense All Optical channel-Dropping Filter," *Journal of Lightwave Technology*, vol. 195, pp. 144-150 (1998).

Lee, C.C., et al., "Measurement of Stimulated-Brillouin-Scattering Threshold for Various Types of fibers Using Brillouin Optical-Time-Domain Reflectometer," *IEEE Photonics Technology Letters*, vol. 12, No. 6, pp. 672-674 (Jun. 2000).

Narayan, A., et al., "High-Efficiency Waveguide Coupled =1.3 μInGa$_x$Ga$_{-x}$As/GaAs MSM Detector Exhibiting Large Extinction Ratios at L and X Band," *IEEE Photonic Technology Letters*, vol. 5, pp. 514-517 (1993).

Oda, K., et al., "A Wide-FSR Waveguide Double-Ring Resonator for Optical FDM Transmission Systems," *Journal of Lightwave Technology*, vol. 9, No. 6, pp. 728-736 (Jun. 1991).

Zmuda, H., et al., "Photonic Beamformer for Phased Array Antennas Using a Fiber Grating Prism," *IEEE Photonics Technology Letters*, vol. 9, No. 2 pp. 241-243 (Feb. 1997).

Mitra, S., "Digital Signal Processing," pp. 788-78 (2002).

\* cited by examiner

Fig. 12a
Refractive index Δn(z) profile of uniform grating:
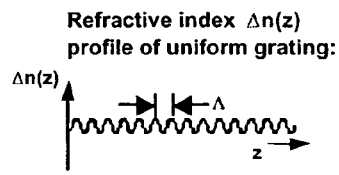
F ↓ transform
Spatial frequency ($f_s$) spectrum for uniform grating:
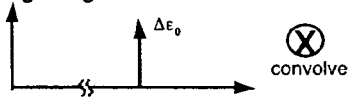
Fig. 12d
Fig. 12b
Sampling function:
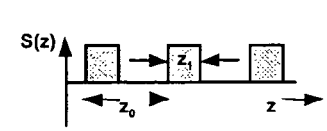
F ↓
Spatial frequency spectrum for Sampling function:
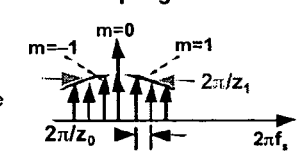
Fig. 12e
Fig. 12c
Resulting index Δn(z) profile of Sampled Grating:
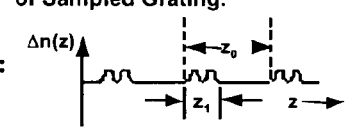
F ↓
Spatial frequency spectrum for resulting Sampled Grating:
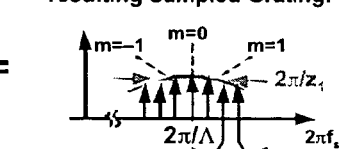
Fig. 12f
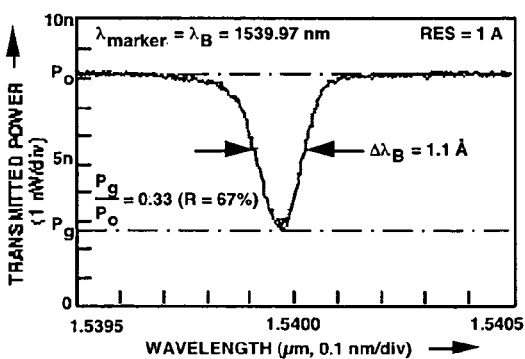
Figure 13a
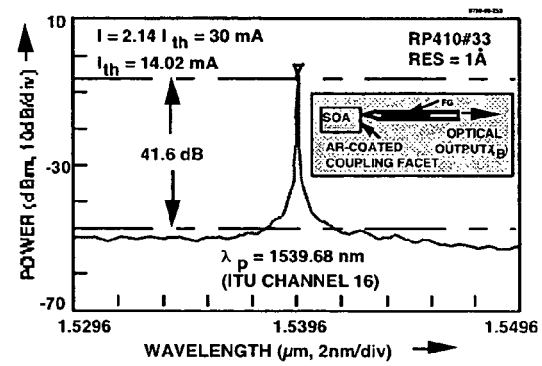
Figure 13b

WAVELENGTH RECONFIGURABLE LASER TRANSMITTER TUNED VIA THE RESONANCE PASSBANDS OF A TUNABLE MICRORESONATOR

CROSS REFERENCE TO RELATED APPLICATIONS

This application is related to U.S. patent application Ser. No. 10/116,800 entitled "Waveguide-Bonded Optoelectronic Device" filed Apr. 5, 2002, which application is hereby incorporated by reference in its entirety.

BACKGROUND INFORMATION

1. Field of the Invention

The present invention relates to a laser transmitter capable of being configured to transmit one of a plurality of wavelengths. Specifically, the laser transmitter may be reconfigured using the resonance passbands of a microresonator.

2. Description of Related Art

More and more applications are using photonic links to transmit signals. For example, in antenna remoting applications, a RF signal can be modulated onto an optical carrier and subsequently sent over an optical link to a remote site for possibly additional processing and for remote RF wave transmission from an antenna or an antenna farm. Wavelength Division Multiplexing (WDM) technologies have much to offer in this application. First, many signals can be multiplexed into one strand of optical fiber via WDM, thus alleviating the need to deploy a large number of fibers for the remoting of an antenna farm. Second, the WDM channel multiplexers hold a tremendous advantage in insertion loss over conventional optical combiners as the number of multiplexed channels increases. For example, an 8:1 WDM multiplexer will demonstrate an optical insertion loss of only 5 dB. In comparison, a conventional optical power-combiner has an optical insertion loss of about 10 dB. For 16:1 and 32:1 multiplexing, the combined losses of WDM multiplexers stay constant at approximately 7 dB.

Transmission of signals via photonic links may also be used in a number of other applications. For example, many systems contain a mixture of analog and digital data that originates from a variety of sensors. Typically, the outputs of these sensors are linked together with affiliated processors and displays via a versatile and reconfigurable network. As discussed above, WDM optical networks offer bandwidth enhancements with a concurrent reduction in the physical number of cables and connectors. These extra cables and connector interfaces represent potential on-board service-points. Minimization of these on-board service-points increases reliability. Reconfigurable WDM networks and components provide a platform with the capabilities to perform changing missions, address changing environments, and reduce the variety of components stocked in the maintenance inventory. Another desire, for some systems, is to reduce the overall power consumption.

The International Telecommunications Union (ITU) has specified a grid of wavelengths (near $\lambda$~1550 nm) as the standard carrier frequencies for Wavelength Division Multiplexing (WDM) networks. Depending upon the desired number of transmission channels, these wavelengths (a.k.a. ITU-channels) are designed to be 50 GHz (=0.4 nm) or 100 GHz (=0.8 nm) apart. By standardizing the carrier frequencies, the ITU hopes to ensure that a WDM network's key passive components, such as wavelength multiplexers/demultiplexers, routers/switches, etc., are spectrally compatible with one another, even though they might be developed by different manufactures. Hence, the emission wavelengths of WDM transmitters are designed to align precisely with the ITU-grid.

Previously, distributed feedback (DFB) or distributed Bragg reflector (DBR) laser structures were commonly employed to provide WDM transmitters with emission wavelengths that align precisely with the ITU-grid. DFBs or DBRs provide single mode laser diodes that emit a wavelength near an ITU-channel. Thermal tuning (at a rate of 0.1 nm/° C.) is then used to move the diode's lasing wavelength into precise alignment with the desired ITU-channel. Finally, an external passive element, typically a Fabry-Perot etalon, is used in a feed back loop as a "wave-locker" to maintain the precise alignment of the wavelength over the long term.

There are several disadvantages to the prior art approach. First, the tuning speed via thermal heating/cooling is slow, typically in the millisecond range. Second, the number of distinct DFB/DBR laser "models" needed multiplies rapidly as the number of wavelength channels increases. In addition, each DFB/DBR laser "model" requires a slightly different fabrication procedure. Finally, the wavelength control feedback loop with the "wave-locker" is physically cumbersome, increasing the size of the transmitter package substantially.

To reduce the inventory count of discrete diode elements in a WDM network, various types of wavelength tunable transmitters have been developed in recent years. These include external cavity lasers, as shown in FIG. 1a, whose emission wavelengths are controlled mechanically via the physical alignment of an external grating. The physical alignment of the external grating is made with respect to the optical feedback path in the laser cavity. In other designs, as shown in FIG. 1b, the wavelength, $\lambda_B$ ($m\lambda_B = 2\Lambda n_{eff}$, where m is an integer) of the distributed Bragg reflector (period=$\Lambda$) in the diode laser is electrically tuned, via current-induced index ($n_{eff}$) changes, to vary the lasing wavelength. However, these tunable DBR lasers require the use of a phase control-section, in addition to the gain and Bragg sections, to accomplish the quasi-continuous wavelength tuning. Furthermore, the implementation of complex multi-variable algorithms is often necessary to guide the bias-currents of all three diode sections, so that the alignment of wavelength, $\lambda_B$ to the ITU-grid can be accomplished and maintained. For more information see Sarlet et. al, "Wavelength and Mode Stabilization of Widely Tunable SG-DBR and SSG-DBR Lasers", *IEEE Photon. Technol. Lett.*, Vol. 11, No. 11, 1999, pp. 1351-1353.

Another prior art solution can be found in J. Berger, et. al, "Widely tunable external cavity diode laser based on a MEMS electrostatic rotary actuator", Paper TuJ2-1, OFC 2001, Anaheim, Calif. This solution utilizes a MEMS-tuned external cavity diode laser as shown in FIGS. 2a and 2b. To achieve compactness, the optical feedback path of this external cavity laser is folded, making the assembly and alignment of the laser chip, lens, diffraction grating, and MEMS-controlled mirror extremely critical for optimal performance. In addition, a relatively large voltage, approximately 140 volts, on the MEMS actuators is needed to rotate the mirrors by ±1.4°. As with other external cavity lasers that are tuned mechanically, the response speed for "hopping" from one ITU-channel to another is slow. Specifically, it takes 15 msec for the MEMS actuators to execute a coarse tuning towards one of the ITU-channels. Finally, "wave-lockers", used in conjunction with software algorithms, are needed to fine-tune these coarse set points to a precise alignment with the ITU-grid.

SUMMARY

In one aspect, the presently disclsoed technology provides a single laser transmitter whose emission wavelengths can be reconfigured to align with specific frequencies. The laser includes a variable microresonator preferably integrated inside the external laser cavity.

In another aspect, the presently disclosed technology provides a method for wavelength tuning a laser comprising the steps of integrating a variable microresonator in an external laser cavity and tuning the microresonator over a set of Bragg reflection wavelengths.

In accordance with yet another aspect, the presently disclosed technology provides a comb of Bragg reflection wavelengths generated from a sampled grating fabricated in a waveguide and preferably a silica waveguide. The fabrication procedure for these gratings enables verification, a priori, that the Bragg-comb is precisely aligned to a given set of frequencies, for example, to the ITU-grid. Because these gratings are formed in a waveguide, the external cavity laser need only consist of a compact guided-wave structure that is chip-scale integrable. Secondly, the resonance passband of the microresonator in the laser cavity is used to select one wavelength, $\lambda_B$, from the comb as the emission wavelength. Since the tuning of the microresonator's passband can be accomplished via electrical injection, response times on the order of nanoseconds can be achieved.

In accordance with still yet another aspect, the emission wavelengths of the transmitter are locked by the Bragg reflection peaks ($\lambda_B$) of a passive sampled grating. Since $\lambda_B$ in these gratings has a low temperature sensitivity of approximately 0.1 Å/° C., the transmitter will demonstrate approximately one tenth the temperature sensitivity of a Group III-V semiconductor, distributed feedback (DFB) laser with respect to environmental temperature perturbations.

In accordance with still yet another aspect of the presently disclosed technology, the transmitter is chip-scale integrable. Specifically, the disclosed embodiments do not require intricate optical cavity designs or mechanical/MEMs devices to accomplish tuning. The solution proposed herein includes a geometric form factor of the waveguide-based Bragg-gratings, which allows utilization of an almost in-line external cavity design using guided-wave components. In addition, the electrical tuning of the microresonator's passband is much more rapid (i.e., with nsec rise times) than are prior art mechanical tunings that have msec response speeds.

In accordance with yet another aspect of the presently disclosed technology, compared with multi-section tunable lasers, is that the presently disclosed technology does not require (i) a multi-variable algorithm to accomplish tuning to a specified wavelength, such as an ITU-wavelength, or (ii) an external "wave-locker" to stay at the specified wavelength. As mentioned above, the Bragg reflection peaks of the sampled grating (SG) are determined a priori. The only tuning required is a coarse overlap of the microresonator's passband to the selected Bragg wavelength. The passive SG acts as an integrated "wave-locker" possessing excellent temperature stability.

BRIEF DESRIPTION OF THE DRAWINGS

Figure 9:
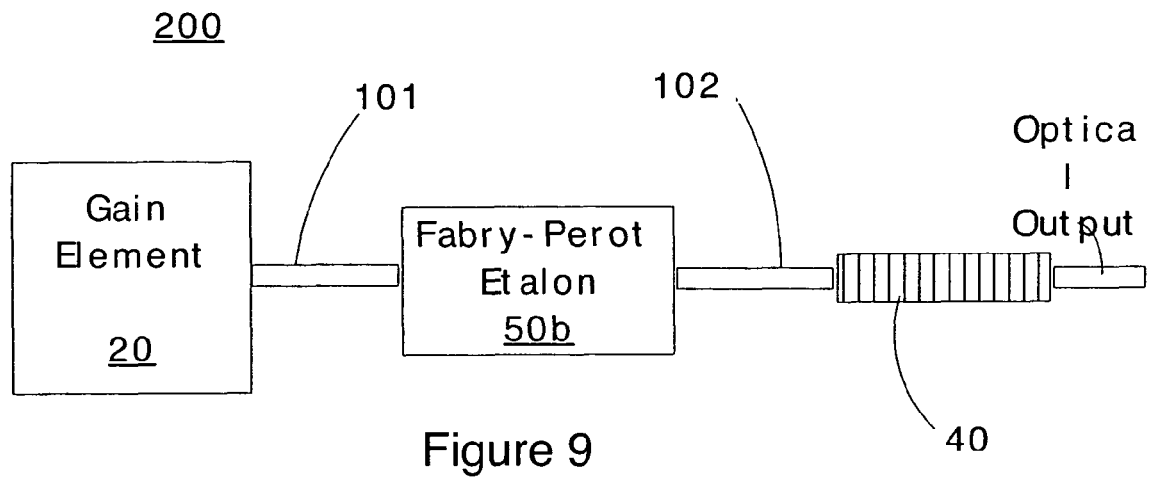
Figure 10:
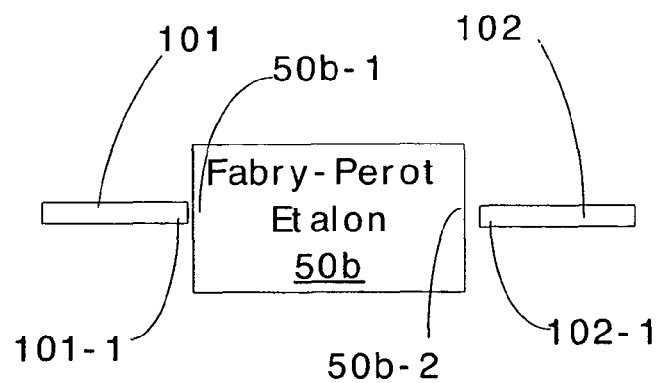
Figure 10A:
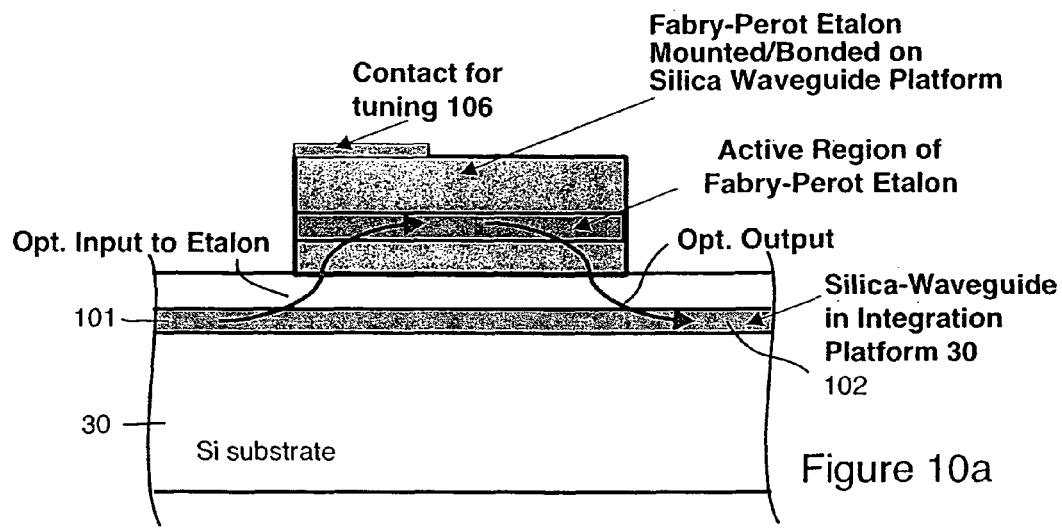
Figure 10B:
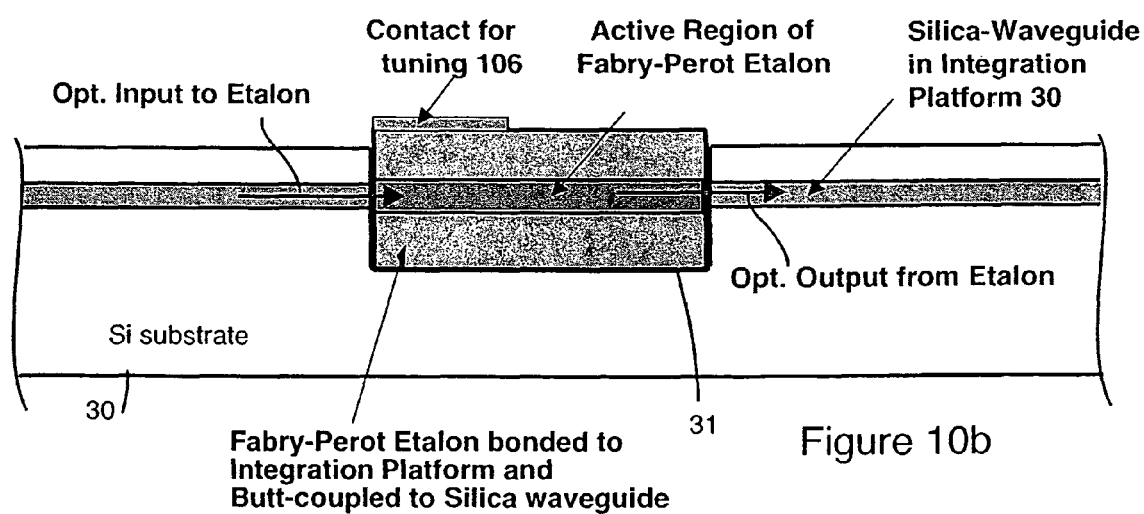
Figure 11:
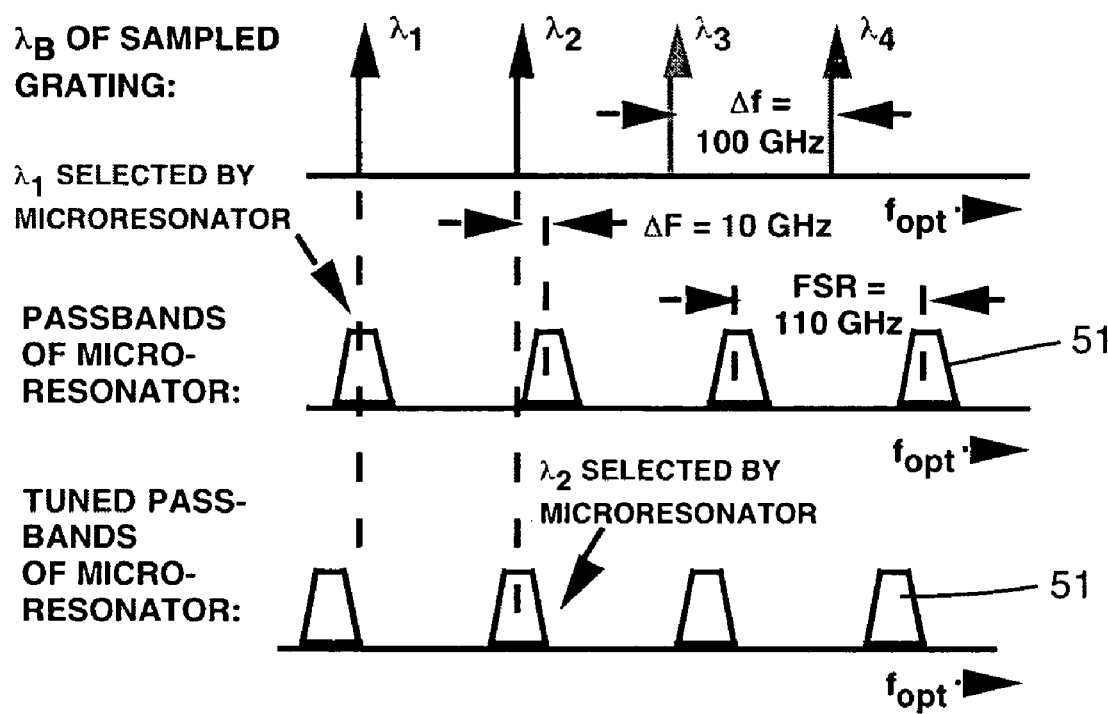

FIG. 9 is a block diagram of a reconfigurable transmitter 200 when a Fabry-Perot etalon 50b is used as the microresonator 50;

FIG. 10 is a top view of one approach used in coupling a semiconductor-based Fabry-Perot etalon to a silica waveguide;

FIGS. 10a and 10b are side elevation views of etalon integrated with or into the integration platform;

FIG. 11 is a depiction of vernier tuning between the Bragg reflection peaks of the sampled grating and the microresonator passbands;

FIGS. 12a-12f are graphs depicting the generation of Bragg reflection spectrum in a UV induced sampled grating;

FIG. 13a is a graph depicting the transmission spectrum of a Bragg optical grating measured in situ; and FIG. 13b is a graph depicting the Emission spectrum of a semiconductor amplifier coupled to the Bragg optical grating.

DETAILED DESCRIPTION

This technology will now be described more fully hereinafter with references to the accompanying drawings, in which preferred embodiments of the invention are shown. This invention may be embodied in many different forms and should not be construed as limited to the embodiments set forth herein.

Figure 1A:
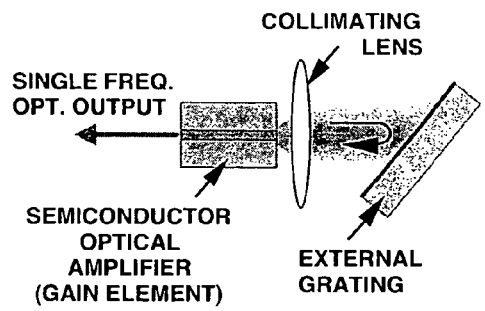
FIG. 1a shows a prior art mechanically tuned external cavity WDM transmitter.
Figure 1B:
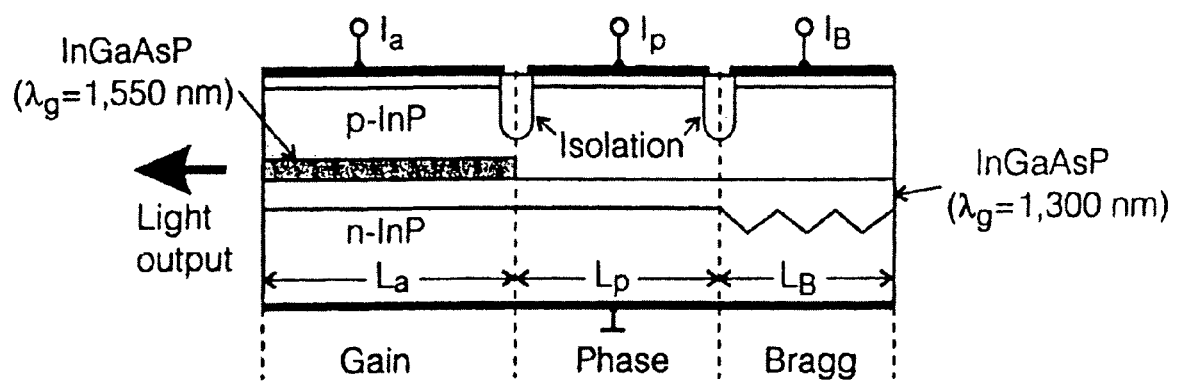
FIG. 1b depicts a prior art three-section tunable semiconductor laser comprising the gain (active), phase-control, and Bragg (DBR) sections.
Figure 2A:
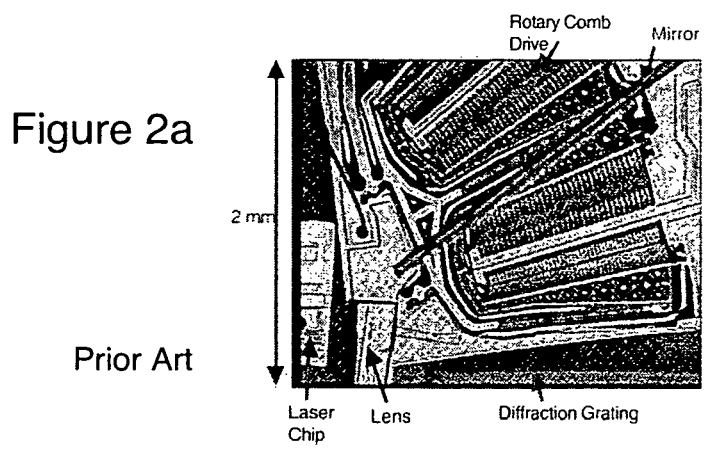
FIG. 2a depicts a micrograph of a prior art MEMS-tuned external cavity laser.
Figure 2B:
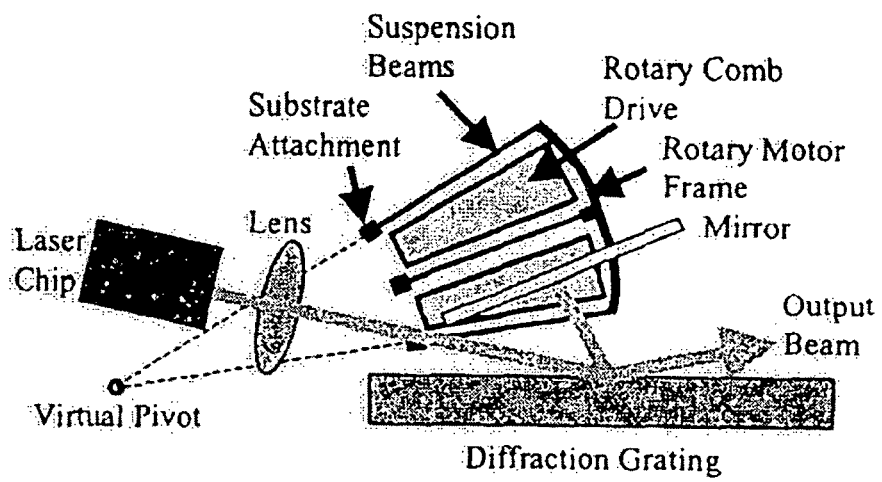
FIG. 2b depicts a schematic of a prior art MEMS-tuned external cavity laser.
Figure 3:
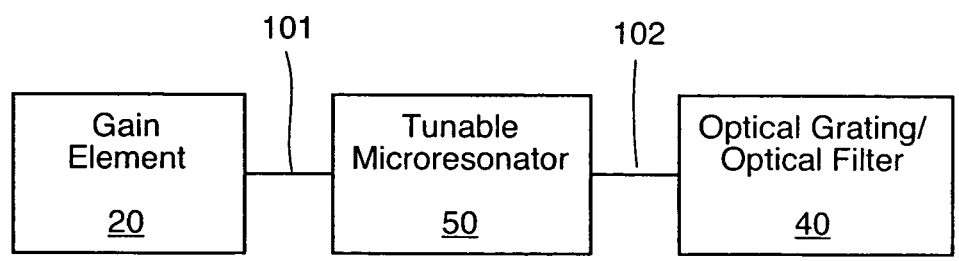
FIG. 3 is a block diagram of a wavelength reconfigurable WDM transmitter in accordance with the presently disclosed technology.

FIG. 3 depicts a schematic diagram of a reconfigurable laser transmitter (RLT) 100 having an external optical cavity in accordance with the presently disclosed technology. The output of a gain element 20 is coupled to a tunable microresonator 50 via an optical path, which is preferably provided by a waveguide 101. A second optical path, which is preferably provided by a waveguide 102, provides an optical path from the tunable microresonator 50 to an optical filter, preferably implemented by an optical grating 40. The external optical cavity includes the optical paths 101 and 102, the tunable microresonator 50 and the optical grating 40. The external optical cavity length defines the set of wavelengths the laser transmitter 100 can support. Among these supported wavelengths, the laser transmitter 100 will transmit the wavelength that has the largest gain, which corresponds to the resonance frequency of the laser transmitter 100. All supported wavelengths will have approximately the same gain when transmitted through the gain element 20. In order to select and transmit the desired wavelength from the plurality of supported frequencies or wavelengths, such as a desired ITU-channel, the tunable microresonator 50 is coupled to the fixed optical grating 40. One of the benefits from using a fixed optical grating 40 is that the fixed optical grating 40 may be fabricated in materials, such as silicon, that are stable over a desired operating temperature range.

Figure 4A:
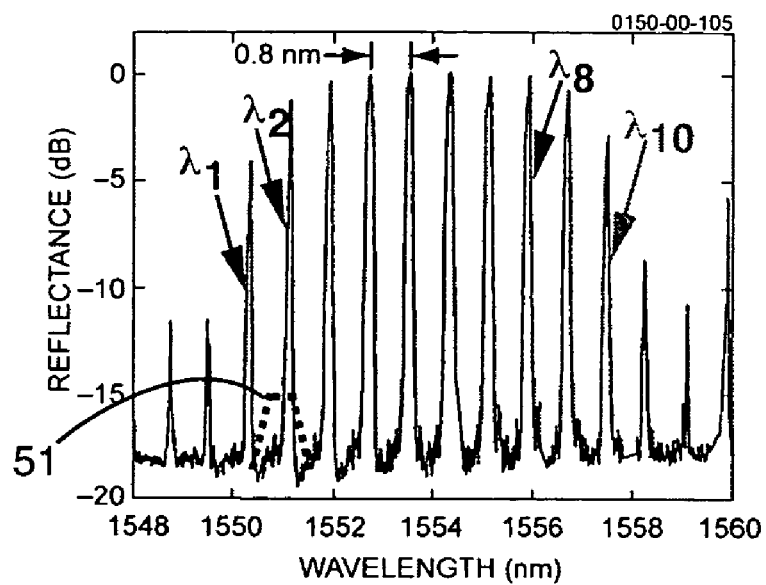
FIG. 4a is a depiction of the generation of multiple Bragg reflection peaks from a sampled grating where the passband of the microresonator aligns with one of the wavelengths $\lambda_2$.
Figure 4B:
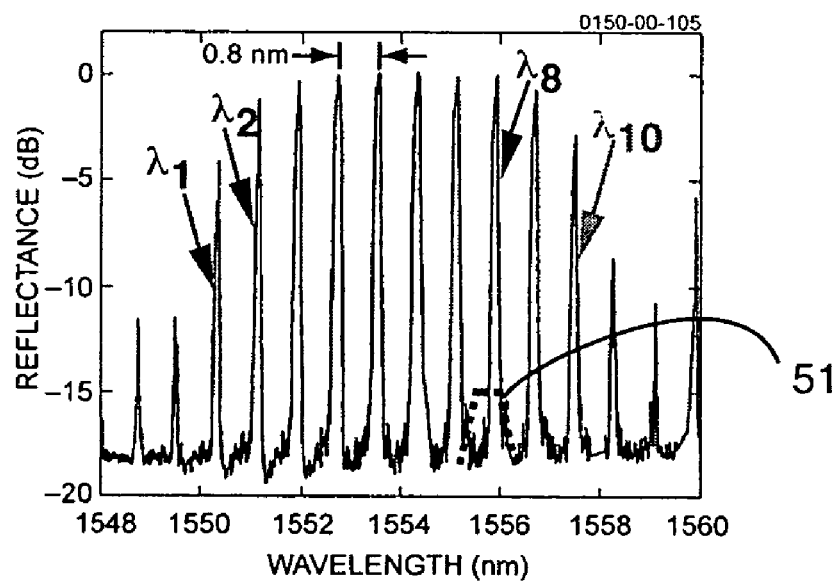
FIG. 4b is a depiction of the generation of multiple Bragg reflection peaks from a sampled grating where the passband of the microresonator aligns with one of the wavelengths $\lambda_8$.

A spectrum of light provided by gain element 20 is passed through the tunable microresonator 50 into the optical grating 40. FIG. 4a illustrates an example of the plurality of supported wavelengths $\lambda_1$-$\lambda_{10}$ that the laser transmitter 100 can support. The tunable microresonator 50 is preferably tuned such that one of the passbands 51 of the tunable microresonator 50 aligns with one of the wavelengths ($\lambda_2$ for the example depicted by FIG. 4a) of the optical grating 40. The tunable microresonator 50 attenuates a portion of the plurality of supported wavelengths. The optical grating 40 then reflects a portion of the selected wavelength back through the optical cavity. Thus, a wavelength ($\lambda_2$ in this example) is selected and becomes the wavelength transmitted by the transmitter 100. FIG. 4b illustrates that the tunable microresonator 50 may later be tuned such that one of the passbands 51 aligns with a different one of the wavelengths ($\lambda_8$ for the example of FIG. 4b) of the optical grating 40. Thus, the wavelength $\lambda_8$ is selected (in this example) and becomes the wavelength transmitted by the transmitter 100.

Figure 5:
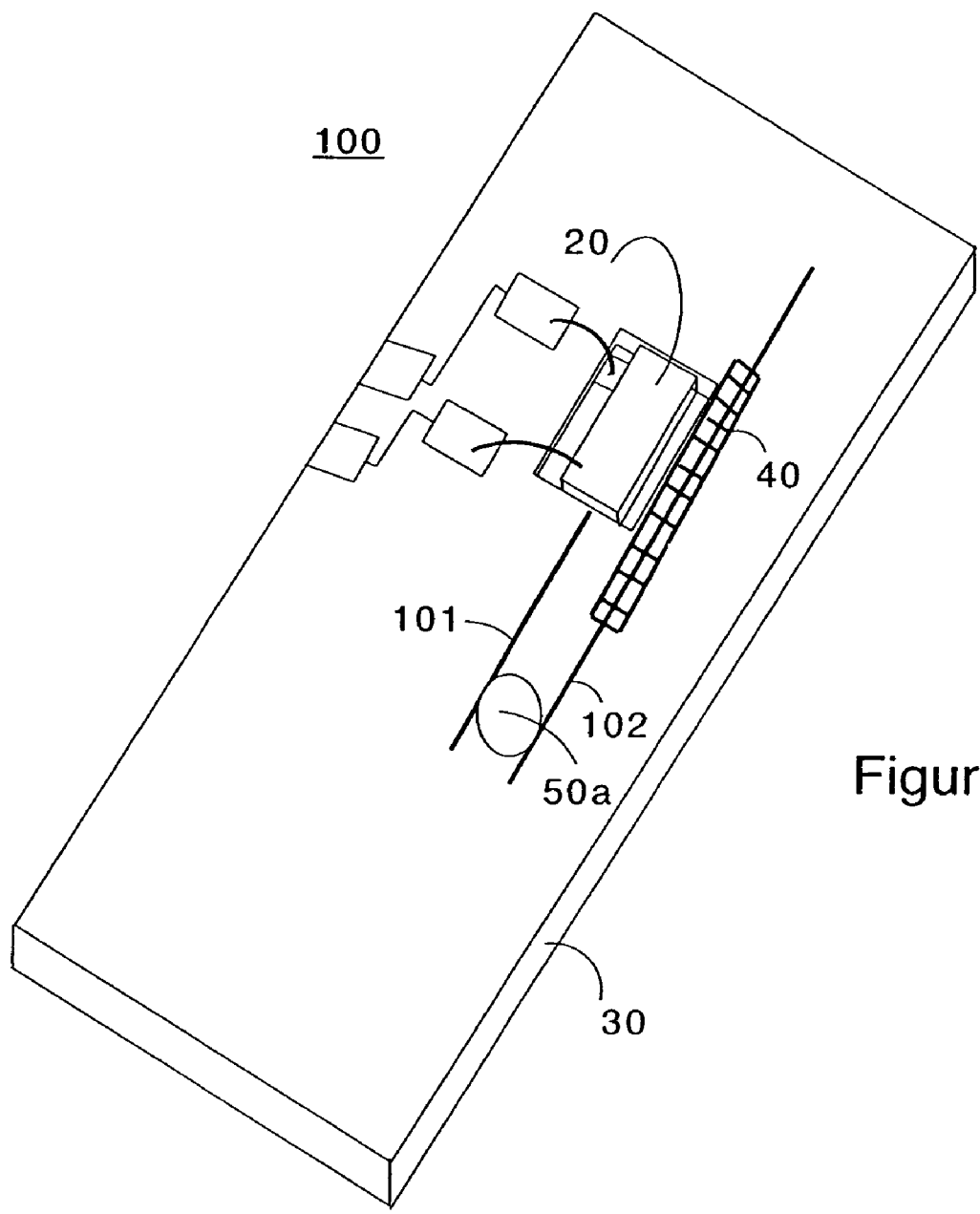
FIG. 5 is an illustration of one embodiment of a wavelength reconfigurable transmitter in accordance with the presently disclosed technology.
Figure 6:
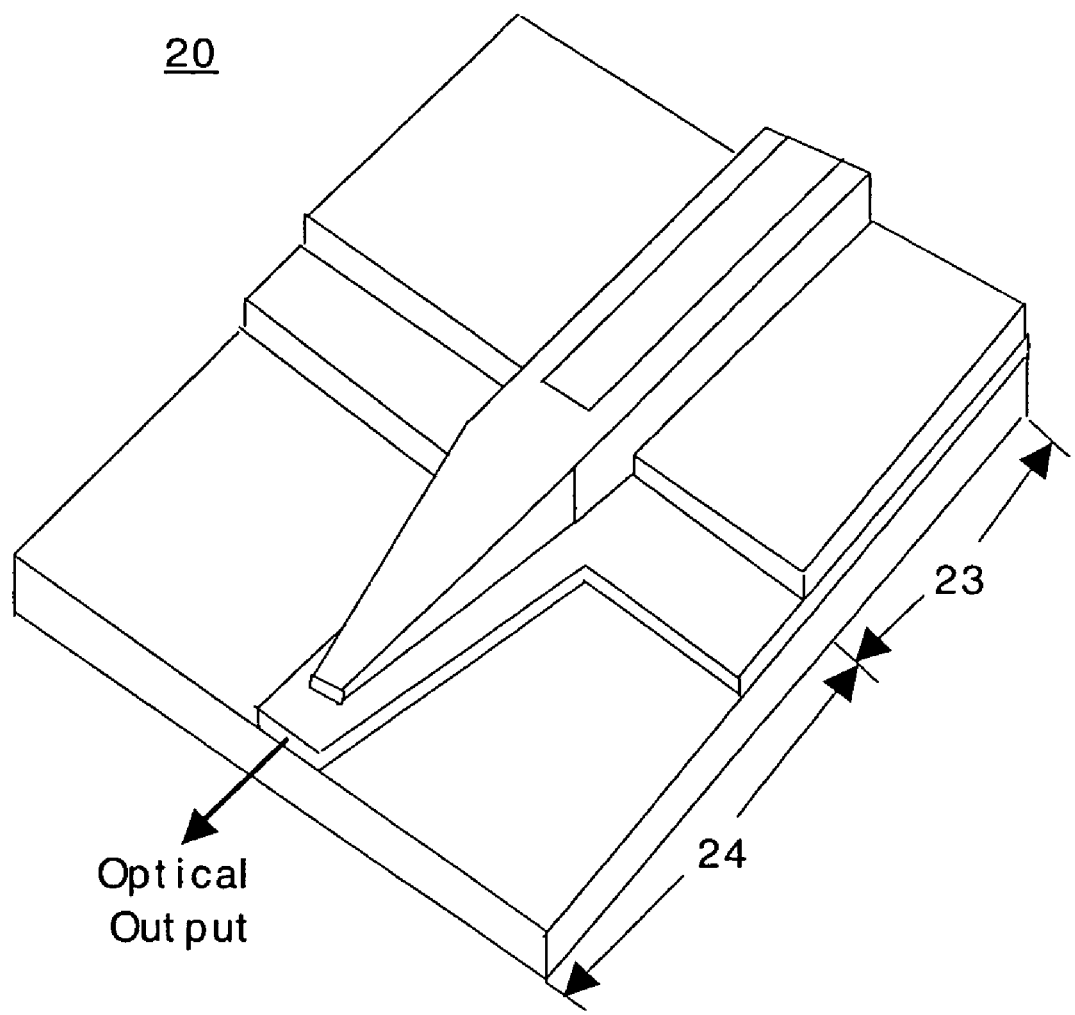
FIG. 6 is a schematic of a spot-size converted (SSC) diode amplifier.

FIG. 5 illustrates one embodiment of the present technology. In FIG. 5, the gain (or active) element 20 of this laser is preferably an optical amplifier 20. The gain element 20 is preferably mounted on an integration platform 30 that serves to facilitate the coupling of optical devices. One common integration platform 30 is a silicon waferboard. The gain element 20 is coupled to waveguide 101 located within the integration platform 30. One skilled in the art will appreciate that there are a number of gain elements 20 well known in the art that may be used. For example, FIG. 6 depicts a GaInAsP/InP semiconductor optical amplifier (SOA) 23 integrated with a spot-size conversion (SSC) taper 24. The SSC taper 24 provides for high coupling efficiency (>50%) to waveguide 101 on the integration platform 30, and allows for relaxed alignment tolerances of ±2 μm between the gain element 20 and the waveguide 101.

The optical output from the gain element 20 is provided to the tunable microresonator 50 (implemented as a microdisk 50a in this embodiment) via waveguide 101. One skilled in the art will appreciate that gain elements, specifically light emitting semiconductor devices, produce a range of wavelengths. Of the range of wavelengths provided to the tunable microresonator 50, only the wavelengths that match passbands 51 of the tunable microresonator 50 are passed to the optical grating 40 via waveguide 102.

One skilled in the art will appreciate that there are many ways well known in the art to couple waveguides 101, 102 and tunable microresonator 50. For example, a thermal annealing approach is discussed in J. M. London, "Preparation of Silicon-on-Gallium Arsenide Wafers for Monolithic Optoelectronic Integration," *IEEE Photon. Technol. Lett.*, Vol. 11, No. 8, 1999, pp. 958-960, herein incorporated by reference, where wafer-bonding occurs between a III-V and a Si-based device, via intermediate layers of deposited dielectric. This thermal annealing approach can be used to accomplish a heterogeneous integration between the tunable microresonator 50, which may be fabricated from a semiconductor material such as GaAs or InP, and the waveguides 101, 102, which may be fabricated from silica material.

Figure 7:
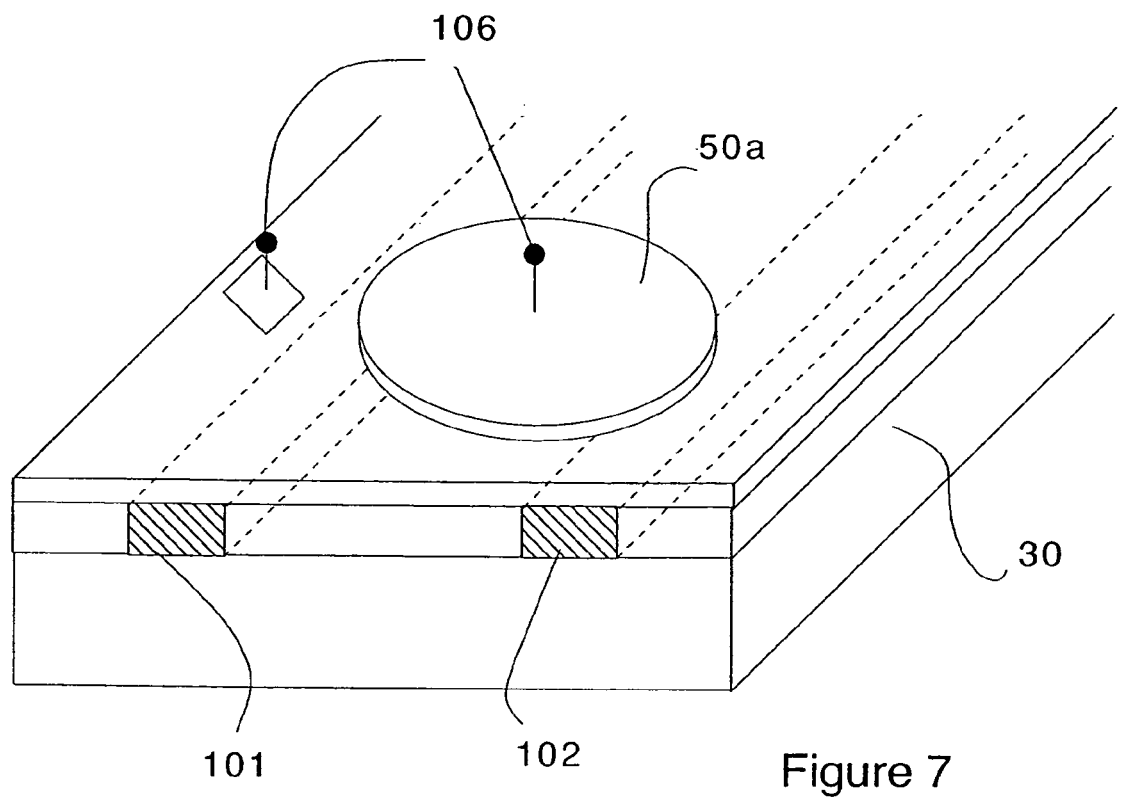
FIG. 7 is a perspective view of a microdisk resonator in accordance with the presently disclosed technology.
Figure 8:
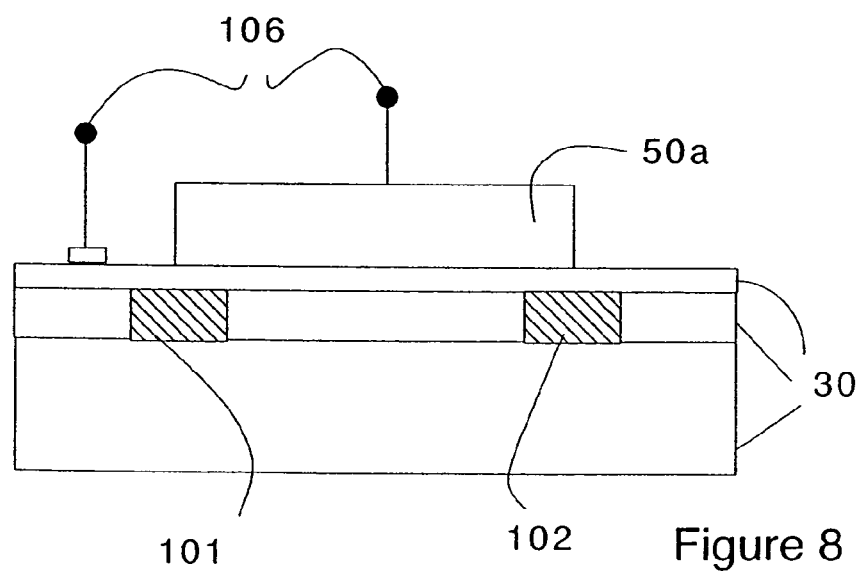
FIG. 8 is a cross section view of a microdisk resonator in accordance with the presently disclosed technology.

In the embodiment illustrated in FIG. 5 the tunable microresonator 50 is preferably implemented as a microdisk 50a. Further details of the microdisk 50a are illustrated in FIGS. 7 and 8. FIG. 7 is a perspective view of the microdisk 50a integrated with the waveguides 101, 102. FIG. 8 is a cross-section view of the microdisk 50a and integration platform 30 containing the waveguides 101, 102. The microdisk 50a is preferably comprised of an optically absorptive material whose optical index can be changed. For further information regarding the structure of the microdisk 50a see U.S. patent application Ser. No. 10/116,800 entitled "Waveguide-Bonded Optoelectronic Device" filed Apr. 5, 2002, which is hereby incorporated herein by reference. Particularly useful electro-optic materials are Gallium Indium Arsenide Phosphide/Indium Phosphide (GaInAsP/InP) and Gallium Arsenide (GaAs). Vertical proximity is used to evanescently couple light from the waveguide 101 to the microdisk 50a. At specific resonance frequencies, the guided wave in the waveguides 101, 102 is strongly coupled to the microdisk 50a that is located above them. The specific resonance frequencies are given by $f_m = m/\tau_d$, where m is an integer and $\tau_d = (2\pi nR)/c$, which is the round trip time in the circular microdisk 50a, R being the radius of the microdisk 50a, n being the refractive index and c being the speed of light. Since $f_m$ is dependent on n, the resonance frequencies of the microdisk 50a can be varied by changing the bias current provided to the microdisk 50a. The resonance frequencies of the microdisk are controlled by controlling the length of time it takes light to travel the circumference of the microdisk 50a, which is done by applying a voltage across the contacts 106 depicted in FIGS. 7 and 8. Thus, the resonance passbands of the GaInAsP/InP microdisk 50a can be electrically tuned.

The free spectral range (FSR) of these microdisk resonances is given by $FSR = \lambda_m^2/(2\pi nR)$, and is thus inversely proportional to the diameter of the microdisk 50a. As will be discussed later, with the FSR reduced tenfold, the vernier-tuning approach offers the advantage of increasing the tunable microresonator's dimensions by the same ratio. Thus, a circular microdisk resonator 50a of a diameter equal to 274 μm may be used in an embodiment where a FSR=100 GHz and a ΔF=10 GHz are required.

Another embodiment is illustrated in FIGS. 9 and 10, where the tunable microresonator 50 is preferably a Fabry-Perot etalon 50b. FIG. 9 is a block diagram of a reconfigurable transmitter 200 when a Fabry-Perot etalon 50b is used as the microresonator 50. The Fabry-Perot etalon 50b is preferably formed from a cleaved piece of III-V semiconductor diode (e.g. GaInAsP/InP). Indeed, the etalon 50b can be integrated with the integration platform 30 that serves to facilitate the coupling of optical devices. FIGS. 10a and 10b depict two ways of integrating the etalon 50b into the integration platform 30. In FIG. 10a the etalon 50b is evanescently coupled to the silica waveguides 101 and 102 while in FIG. 10b the etalon 50b is butt-coupled to silica waveguides 101 and 102 by placing it in a micro-machined (etched) slot 31 in integration platform 30. In FIG. 10a waveguides 101 and 102 form the input portion and output portion of a single waveguide 101, 102.

FIG. 10 is a top view of one approach used in coupling a semiconductor-based Fabry-Perot etalon 50b to silica waveguides. One skilled in the art will appreciate that there are many methods of coupling a Fabry-Perot etalon to a silica waveguide known in the art such as passive alignment. Passive alignment is discussed by John V. Collins et al. "Passive Alignment of Second Generation Optoelectronic Devices," *IEEE Journal of Sel. Topics in Quantum Electronics*, Vol. 3, No. 6, 1997, pp. 1441-1444 and by M. Cohen et al. *IEEE Trans. Components, Hybrids and Mfg Technology*, Vol. 15, No. 6, December 1992, both documents being herein incorporated by reference. In the example shown in FIG. 10, the silica waveguide facet 101-1 preferably has an anti-reflective (AR) coating disposed on the facet closest to the Fabry-Perot etalon 50b. The Fabry-Perot etalon 50b facets 50b-1, 50b-2 are preferably not AR coated, rather are preferably simply cleaved. The silica waveguide facet 102-1 preferably also has an AR coating on the facet closet to the Fabry-Perot etalon 50b. The waveguide facets 101-1, 102-1 and the Fabry-Perot etalon facets 50b-1, 50b-2 are aligned to provide efficient coupling between the waveguides 101, 102 and the Fabry-Perot etalon 50b. The etalon is tuned by attaching an electrode to the etalon and an electrode to the wafer board similar to a microdisk.

One skilled in the art will appreciate that there are multiple approaches to tuning the passbands 51 of the tunable microresonator 50, which, in case of the presently disclosed technology, results in selecting the Bragg wavelength $\lambda_B$ in the reflection spectrum of a fixed optical grating 40, which could be a sampled grating fabricated in a silica optical waveguide. Tuning a tunable microresonator 50 enables the transmitter's emission wavelength to be changed from one wavelength to another wavelength, within a set of specified wavelengths, for example, from one ITU-channel to another ITU-channel. Preferably, the tunable microresonator 50 is tuned electrically in order to provide fast response times. One skilled in the art will appreciate that any manner of tuning may be used in order to provide response times suitable for the given application. Two electrically tuning approaches will be discussed herein and are provided as examples only.

In one approach of electrically tuning microresonators, the free spectral range (FSR) of the tunable microresonator 50 is designed to cover the entire tuning range of the transmitter 100. The design of the fixed optical grating 40 used in this example will be discussed in detail later in this specification. Preferably, for the fixed optical grating 40, the tuning range covers approximately ten wavelengths (with $\Delta f=100$ GHz). Therefore, $f_m$, the $m^{th}$ resonance frequency of the tunable microresonator 50, is tuned over a frequency range of $\delta f_m$ of approximately 1,000 GHz.

As previously discussed, in one embodiment the tunable microresonator 50 may be a Fabry-Perot etalon 50b as depicted by FIG. 9 having a physical length L. The following equations describe the fractional change in $f_m$ ($f_m \sim 2\times 10^{14}$/sec for $\lambda \sim 1550$ nm) with respect to its optical length, $L_{opt}$:

$$\frac{\delta f_m}{f_m} = \frac{\delta L_{opt}}{L_{opt}} = \frac{\delta n}{n}$$

where n is the refractive index for the waveguide in the Fabry-Perot etalon 50b. With a the physical length L of approximately 43 μm, a fractional index change (δn/n) of 0.5% will accomplish a $\delta f_m$ of ~1,000 GHz. Thus, a tuning current of ~24 mA can move the passband 51 depicted in FIGS. 4a and 4b from $\lambda_1$ to $\lambda_{10}$ for an etalon 50b fabricated from a semiconductor material such as GaAs or InP. The current tuning also enables a fine degree of control in moving the tunable microresonator's passband 51 from one Bragg peak to the next (e.g. $\lambda_2$ to $\lambda_3$). For example, for a $\delta f_m$ of ~100 GHz, a fractional index change of 0.05% is required, which corresponds to a current of ~2.4 mA. One skilled in the art will appreciate that the fractional index change could be provided through a change in voltage supplied to the tunable microresonator rather than a change in current.

As also previously discussed in another embodiment, tunable microresonator 50 may be a microdisk 50a as depicted by FIG. 7, and more particularly, a microdisk 50a having a radius R. In the present example, in order to support a FSR of ~1,000 GHz (e.g. 10 ITU channels), R is preferably selected to be ~13 μm. A tuning current of ~25.5 mA will move the microdisk's passband from $\lambda_1$ to $\lambda_{10}$. The tuning current also enables a fine degree of control in moving the tunable microresonator's passband 51, depicted in FIGS. 4a and 4b, from one Bragg peak to the next (e.g. $\lambda_2$ to $\lambda_3$). For example, a small tuning current of ~2.55 mA will tune the passband over $\delta f_m$ of ~100 GHz.

In another approach of electrically tuning microresonators 50, a vernier-tuning concept is applied to achieve a potentially even larger tuning range. The vernier-tuning concept is illustrated in FIG. 11. When the tunable microresonator 50 is tuned, successive passbands 51 of the tunable microresonator 50 are moved to overlap, one at a time, with successive Bragg reflection peaks $\lambda_1 \ldots \lambda_4$ from the sampled grating 40, as is illustrated in FIG. 11. The vernier mechanism is often used in multi-section GaInAsP/InP distributed Bragg reflector (DBR) lasers to achieve ultra-broad ranges. These DBR lasers apply the vernier mechanism to internal cavity designs. In the present invention, the vernier-tuning concept is applied to an external cavity design. To achieve the spectrum shown in FIGS. 4a and 4b, the tunable microresonator's FSR is designed to be ~110 GHz, so that the FSR is close to the frequency spacing of ($\Delta f$) of 100 GHz between the Bragg reflection peaks. The vernier effect provides an increased tuning range obtained via $\Delta n/n$ by a lever-factor equal to FSR/($\Delta F$), where $\Delta F=\text{FSR}-\Delta f$. Thus:

$$\frac{\delta f_m}{f_m} = \frac{\delta n}{n} \times \frac{FSR_{microresonator}}{\Delta F}$$

In one embodiment, FSR=100 GHz and $\Delta F=10$ GHz, resulting in a vernier multiplier of 10. Thus, the tuning current required to achieve a tuning range of $\delta f_m$ of ~1,000 GHz is only several mA. Therefore, a much larger tuning range may be achieved via the vernier effect. In addition, the bandwidths of the passbands 51 of the tunable microresonator 50 need only be 10-15 GHz (for a finesse of F~10) to execute discriminatory selection of a specific Bragg reflection peak.

The optical grating 40 is preferably written such that the wavelengths of the optical grating 40 are aligned to a desired set of frequencies, for example to the ITU-grid. The optical grating 40 is preferably a sampled Bragg grating fabricated in a material that has a low temperature sensitivity (on the order of 0.1 Å/° C.), such as silica. The sampled grating exhibits multiple Bragg reflection peaks from one grating. In particular, the $\lambda$ spacing ($\Delta\lambda=0.8$ nm in FIG. 4a) between the peaks is set by the period of a modulation envelope impressed on the grating profile. As shown in FIG. 4a, one can obtain more than ten Bragg reflection peaks with reflectance>32% in a single grating. By tuning the passband 51 of the tunable microresonator 50, any of the Bragg reflection peaks may be chosen to set the transmitter's lasing wavelength, as is shown in FIGS. 4a and 4b. By using the tunable microresonator 50 coupled to the sampled grating, different wavelengths can be provided without the need for bulky "wave-lockers". One skilled in the art will appreciate that the passband characteristics of the tunable microresonator 50 need only offer very modest finesse (in the range of approximately 10-50) for the transmitter 100 to achieve single frequency oscillation in any of the ten Bragg wavelengths $\lambda_1 \ldots \lambda_{10}$. The lasing characteristics (e.g. side mode suppression ratio (SMSR)) of the transmitter 100 are mostly determined by the gain element 20, spectral width ($\Delta\lambda_B$) of the sampled grating and Bragg reflectance of the sampled grating.

In one embodiment, the sampled grating is a UV-induced Bragg grating 40 fabricated in a waveguide 102 located at the output end of the transmitter 100. See, for example, the embodiment of FIG. 5. The waveguide 102 preferably comprises a Ge-doped core that results in high photosensitivity. UV-induced gratings may be written using a transmissive phase mask and an excimer laser having a wavelength of approximately 2480 nm. The high photosensitivity of the Ge-doped core allows for reproducibility in writing the UV-induced gratings. For further information regarding the fabrication of UV-induced Bragg gratings, see W. Ng et. al, "*High speed single and multi-element fiber-grating coupled laser transmitter for WDM networks*", Paper FJ5, LEOS'98, Orlando, Fla., which paper is incorporated herein by reference.

The following is a brief discussion of how multiple Bragg reflection peaks are derived from the optical grating 40. As illustrated in FIGS. 12a through 12f, the formation of an optical grating 40 is achieved by the impression of a modulation envelope, defined by the sampling function S(z) 203, see FIG. 12b, on the refractive index profile $\Delta n(z)$ 201 of a uniform grating, see FIG. 12a. Basically, an amplitude-mask is added and cascaded with a conventional phase-mask through which the UV-induced grating is written. In the spatial frequency domain, as shown in FIGS. 12d through 12f, the uniform grating 201 (with period $\Lambda$) transforms to a $\delta$-function at $f_s=2\pi/\Lambda$, as shown in FIG. 12d whereas the sampling function 203 transforms to a series of periodic impulses that are separated by $2\pi/z_o$, as shown in FIG. 12e. When these two spectra are convolved to form the spatial spectrum of the sampled grating, the series of Fourier components are centered at $2\pi/\Lambda$ and separated by $2\pi/z_1$, as shown in FIG. 12f. Each of these spatial Fourier components results in a Bragg reflection peak in the reflection spectrum of the sampled grating. Thus, the $\lambda$-spacing $[\Delta\lambda=\lambda^2/(2\pi z_o)]$ of the reflection peaks is determined by $z_o$, the period of the sampling function 203. For example, a $z_o$ of ~1 mm will lock $\Delta\lambda$ to a spacing of 0.8 nm. In addition, the number of Bragg reflection wavelengths can be increased by decreasing the duty cycle, $z_1/z_o$, of the sampling function.

In addition to being able to select the wavelength of interest, a transmitter is also provided whose emission wavelengths can be aligned to a specified set of wavelengths, i.e., the ITU-grid. FIG. 13a depicts the transmission spectrum of a Bragg fiber-grating measured in situ. One skilled in the art will appreciate that one can characterize, in situ, the Bragg wavelength ($\lambda_B$), half-width ($\Delta\lambda_B$) and the grating's reflectivity (R) as the grating is fabricated. This a priori knowledge ensures that the Bragg wavelengths of the sampled grating are well aligned with the set of specified wavelengths, for example the ITU-channels. FIG. 13b shows the lasing spectrum observed when the gain element 20 is coupled to the Bragg fiber-grating. As shown, a side mode suppression ratio (SMSR) of >40 dB at $\lambda_B$ is achieved.

In another embodiment, a fixed optical-resonator filter designed to the set of frequencies desired can replace the fixed optical grating 40. Just as the optical grating 40 is designed to provide the set of desired frequencies, for example the set of desired ITU-channels, a fixed optical-resonator filter may also be designed to provide the same set of desired frequencies. As an example, the fixed optical-resonator filter may be an etalon.

From the forgoing description, it will be apparent that the present invention has a number of advantages, some of which have been described herein, and others of which are inherent in the embodiments of the invention described herein. Also, it will be understood that modifications can be made to the method described herein without departing from the teachings of the subject matter described herein. As such, the invention is not limited to the described embodiments except as required by the appended claims.

What is claimed is:

1. A reconfigurable laser transmitter comprising:
   an integration platform having a silicon substrate;
   a gain element, having an optical output, the gain element having a body of material different than said integration platform, being disposed on said integration platform;
   a first optical path receiving optical output from said gain element, said first optical path comprising a silica waveguide within said integration platform;
   a tunable microresonator optically coupled with said first optical path, said tunable microresonator having a body of material different than said silica waveguide and being disposed on said integration platform;
   a second optical path coupled with said tunable microresonator, said second optical path comprising a silica waveguide within said integration platform; and
   a fixed grating in said integration platform and coupled with said second optical path.

2. The reconfigurable laser transmitter of claim 1 wherein said tunable microresonator comprises a microdisk or a Fabry-Perot etalon.

3. The reconfigurable laser transmitter of claim 2 wherein said microdisk is heterogeneously attached to said integration platform.

4. The reconfigurable laser transmitter of claim 1 wherein said fixed grating is fabricated in a material having a temperature sensitivity less than or equal to 0.1 Å/° C.

5. The reconfigurable laser transmitter of claim 1 wherein said tunable microresonator is electrically tuned.

6. The reconfigurable laser transmitter of claim 1 wherein said tunable microresonator is vernier tuned.

7. The reconfigurable laser transmitter of claim 1 wherein said fixed grating is a sampled grating.

8. The reconfigurable laser transmitter of claim 1 wherein the gain element is a laser and wherein the fixed grating is a sample grating having Bragg reflection peaks for locking the laser thereto.

9. The reconfigurable laser transmitter of claim 1 wherein the gain element provides an optical signal at its optical output, wherein the fixed grating generates a sequence of Bragg reflectivity peaks in the optical signal and wherein a passband of the tunable microresonator selects one of the peaks in said sequence of Bragg reflectivity peaks.

10. The reconfigurable laser transmitter of claim 1 wherein the gain element is a semiconductor optical amplifier.

11. The reconfigurable laser transmitter of claim 1 wherein the gain element is a GaInAsP/InP semiconductor optical amplifier.

12. The reconfigurable laser transmitter of claim 11 wherein the microresonator is has a body comprising GaInAsP/InP semiconductor materials.

13. A method for reconfiguring a wavelength of a laser comprising the steps of:
- providing an integration platform formed of silicon;
- coupling a tunable microresonator having a passband to a fixed grating having a plurality of reflection peaks via a silica waveguide in said integration platform, said silica waveguide including a UV-induced sampled grating;
- heterogeneously mounting the tunable microresonator on said integration platform, said tunable microresonator being formed of a material different than the silica waveguide; and
- tuning said tunable microresonator such that the passband of said tunable microresonator is aligned with one of said plurality of reflection peaks of said fixed grating.

14. The method of claim 13 wherein said tunable microresonator is a microdisk or a Fabry-Perot etalon.

15. The method of claim 13 where said step of tuning is done electrically.

16. The method of claim 13 wherein said fixed grating is fabricated in a material having a temperature sensitivity less than or equal to 0.1 Å/° C.

17. The method of claim 13 wherein said fixed grating is a sampled grating.

18. The method of claim 13 wherein said step of tuning is vernier tuning.

19. A method of configuring a transmitter to transmit one of a plurality of wavelengths, said method comprising the steps of:
- passing a spectrum of light from a gain element into a tunable Fabry-Perot etalon or microdisk microresonator;
- selecting a first portion of said spectrum of light to be transmitted by said transmitter;
- electrically tuning said tunable Fabry-Perot etalon or microdisk microresonator, wherein a second portion of said spectrum of light is transmitted to a sampled grating fabricated in a silica waveguide for reflection back to said gain element;
- forming at least another silica waveguide in a silicon integration platform, and
- forming the tunable Fabry-Perot etalon or microdisk microresonator from III-V semiconductor material on or in said silicon integration platform so that the Fabry-Perot etalon or microdisk microresonator is optically coupled with said at least two silica waveguides.

20. The method of claim 19 wherein the gain element is a GaInAsP/InP semiconductor optical amplifier.

21. A method of configuring a transmitter to transmit one of a plurality of wavelengths, said method comprising the steps of:
- passing a spectrum of light from a gain element into a tunable Fabry-Perot etalon or microdisk microresonator;
- selecting a first portion of said spectrum of light to be transmitted by said transmitter;
- electrically tuning said tunable Fabry-Perot etalon or microdisk microresonator, wherein a second portion of said spectrum of light is transmitted to a sampled grating fabricated in a silica waveguide for reflection back to said gain element;
- wherein the gain element is a GaInAsP/InP semiconductor optical amplifier; and
- wherein the Fabry-Perot etalon or microdisk microresonator has a body comprising GaInAsP/InP semiconductor materials.

22. A method of configuring a transmitter to transmit one of a plurality of wavelengths, said method comprising the steps of:
- passing a spectrum of light from a group III-V gain element into a tunable group III-V Fabry-Perot etalon;
- selecting a first portion of said spectrum of light to be transmitted by said transmitter; and
- electrically tuning said tunable Fabry-Perot etalon, wherein a second portion of said spectrum of light is transmitted to a sampled grating fabricated in a silica waveguide for reflection back to said gain element, wherein the gain element has a body comprising GaInAsP/InP semiconductor materials and wherein the Fabry-Perot etalon also has a body comprising GaInAsP/InP semiconductor materials.

23. The method of claim 22 wherein the gain element is a semiconductor optical amplifier.

24. A method of configuring a transmitter to transmit one of a plurality of wavelengths, said method comprising the steps of:
- passing a spectrum of light from a gain element into a tunable Fabry-Perot etalon;
- selecting a first portion of said spectrum of light to be transmitted by said transmitter; and
- electrically tuning said tunable Fabry-Perot etalon, wherein a second portion of said spectrum of light is transmitted to a sampled grating fabricated in a silica waveguide for reflection back to said gain element, wherein said sampled grating has a sequence of Bragg reflectivity peaks and wherein a passband of the tunable Fabry-Perot etalon selects one of the peaks in said sequence of Bragg reflectivity peaks.

25. The method of claim 24 wherein the gain element is a semiconductor optical amplifier.

26. A method of configuring a transmitter to transmit one of a plurality of wavelengths, said method comprising the steps of:
- passing a spectrum of light from a group III-V gain element into a tunable group III-V Fabry-Perot etalon;
- selecting a first portion of said spectrum of light to be transmitted by said transmitter; and
- electrically tuning said tunable Fabry-Perot etalon, wherein a second portion of said spectrum of light is transmitted to a sampled grating fabricated in a silica waveguide for reflection back to said gain element, wherein said sampled grating has a sequence of Bragg reflectivity peaks and wherein a passband of the tunable Fabry-Perot etalon selects one of the peaks in said sequence of Bragg reflectivity peaks.

27. A method of configuring a transmitter to transmit one of a plurality of wavelengths, said method comprising the steps of:
- passing a spectrum of light from a gain element into a tunable Fabry-Perot etalon or microdisk microresonator;
- selecting a first portion of said spectrum of light to be transmitted by said transmitter; and
- electrically tuning said tunable Fabry-Perot etalon or microdisk microresonator, wherein a second portion of said spectrum of light is transmitted to a sampled grating fabricated in a silica waveguide for reflection back to said gain element;
- wherein said tunable Fabry-Perot etalon or microdisk microresonator is of a different material than the silica waveguide;
- wherein said sampled grating has a sequence of Bragg reflectivity peaks; and wherein a passband of the tunable Fabry-Perot etalon or microdisk microresonator selects one of the peaks in said sequence of Bragg reflectivity peaks.

28. The method of claim 27 wherein the gain element is a semiconductor optical amplifier.

29. The method of claim 27 wherein the step of electrically tuning said tunable Fabry-Perot etalon or microdisk microresonator causes the transmitter, by vernier tuning, to tune over a number of Bragg reflection peaks generated by the sampled grating.

30. The method of claim 29 wherein the electrically tuning step comprises moving, by injection of current, successive passbands of the tunable Fabry-Perot etalon or microdisk microresonator, so that they coincide, one at a time, with the Bragg reflection peaks generated by the sampled grating.

31. The method of claim 27 wherein said step of electrically tuning further comprises the step of vernier tuning.

32. The method of claim 27 wherein the step of selecting a first portion further comprises the step of coupling a fixed optical grating to said tunable Fabry-Perot etalon or microdisk microresonator.

33. The method of claim 32 wherein said fixed optical grating is a UV-induced sampled grating.

34. The method of claim 27 wherein the step of selecting a first portion further comprises the step of coupling a fixed optical-resonator filter to said tunable Fabry-Perot etalon or microdisk microresonator.

35. The method of claim 27 wherein said spectrum of light corresponds to predetermined frequencies set according to an international standard.

* * * * *